United States Patent [19]

Chuang

[11] Patent Number: 5,937,309
[45] Date of Patent: Aug. 10, 1999

[54] METHOD FOR FABRICATING SHALLOW TRENCH ISOLATION STRUCTURE

[75] Inventor: Shu-Ya Chuang, Hsinchu Hsien, Taiwan

[73] Assignee: United Semiconductor Corp., Hsinchu, Taiwan

[21] Appl. No.: 09/241,977

[22] Filed: Feb. 1, 1999

[30] Foreign Application Priority Data

Nov. 23, 1998 [TW] Taiwan .................................. 87119382

[51] Int. Cl.$^6$ .................................................. H01L 21/76
[52] U.S. Cl. .......................... 438/424; 438/437; 438/701; 438/978; 148/DIG. 50; 148/DIG. 161
[58] Field of Search ..................................... 438/424, 437, 438/701, 978, FOR 227; 148/DIG. 50, DIG. 161

[56] References Cited

U.S. PATENT DOCUMENTS 5,674,775  10/1997  Ho et al. .
5,801,083   9/1998  Yu et al. .................................. 438/424

Primary Examiner—Teresa M. Arroyo
Assistant Examiner—Long Pham
Attorney, Agent, or Firm—Jiawei Huang; J. C. Patents

[57] ABSTRACT

A method for fabricating a shallow trench isolation (STI) structure in a semiconductor substrate. A stop layer is formed on the substrate and a first sacrificial layer is formed on the stop layer. The first sacrificial layer and the stop layer are defined to form an opening on the substrate. A conformal second sacrificial layer with rounded corners is formed on the substrate. The second sacrificial layer, the first sacrificial layer, and a portion of the substrate are anisotropically removed to form a trench in the substrate using the stop layer as a removal stop layer. The substrate is over removed using the stop layer as a mask layer so that spacers of the second sacrificial layer are remained on the substrate to cover portions of sidewalls of the stop layer.

13 Claims, 3 Drawing Sheets

METHOD FOR FABRICATING SHALLOW TRENCH ISOLATION STRUCTURE

CROSS-REFERENCE TO RELATED APPLICATION

This application claims the priority benefit of Taiwan application serial no. 87119382, filed Nov. 23, 1998, the full disclosure of which is incorporated herein by reference.

BACKGROUND OF THE INVENTION

1 Field of Invention

The present invention relates to a semiconductor device fabrication. More particularly, the present invention relates to a method for fabricating a shallow trench isolation (STI) structure on a semiconductor substrate.

2. Description of Related Art

With the development of technologies in integrated circuits, device minimization and high integration become more and more important subjects in semiconductor device fabrication. Since the dimensions of devices are gradually reduced and the integration is gradually increased, isolation structures of devices are also minimized so that the technology of forming the isolation structures becomes more and more difficult. One method of forming the isolation structures is to form a field oxide layer by local oxidation (LOCOS). But the field oxide layer is restricted by its bird's beak shape, and so it is really difficult to minimize the dimensions of the field oxide layer. Accordingly, other device isolation structures have been gradually developed, of which shallow trench isolation (STI) structures are most widely used for device isolation. At present, the shallow trench isolation (STI) structures are widely used in semiconductor device fabrication at the sub-half micron level.

FIG. 1 is a schematic, cross-sectional view of a shallow trench isolation structure.

A method of forming a shallow trench isolation (STI) structure is to anisotropically etch a semiconductor substrate 100, using a silicon nitride layer (not shown) as a hard mask. A trench 110 is then formed in the substrate 100. A liner oxide layer 115 is formed on the trench 110 by thermal oxidation. A silicon oxide layer 120 is formed over the substrate 100 to fill the trench 110. The silicon nitride layer is removed. A device isolation structure is thus formed.

In STI process, rounding top corners 110a and bottom corners 110b of the trench 110 is the most important issue. If the top corners 110a and the bottom corners 110b of the trench 110 are not rounded, stress is generated at the top corners 110a and the bottom corners 110. Therefore, the top corners 110a and the bottom corners 110b of the trench 110 are rounded so that the stress and the electric field are minimized. Accordingly, the operating conditions for etching and thermal oxidation are controlled carefully. However, the results are still unreliable in the conventional method.

SUMMARY OF THE INVENTION

Accordingly, the present invention provides a method for fabricating a shallow trench isolation (STI) structure with rounded top corners and bottom corners; in other words, the shallow trench isolation (STI) structure has a smooth profile. Thus an electric field and stress generated at the corners of the trench are minimized.

To achieve these and other advantages and in accordance with the purpose of the invention, as embodied and broadly described herein, the invention provides a method for fabricating a shallow trench isolation (STI) structure in a semiconductor substrate. A stop layer is formed on the substrate. A first sacrificial layer is formed on the stop layer. The first sacrificial layer and the stop layer are defined to form an opening on the substrate. A conformal second sacrificial layer with rounded top corners and bottom corners is formed on the substrate. The second sacrificial layer, the first sacrificial layer, and the substrate are removed to form a trench in the substrate while using the stop layer as a removal stop layer. The substrate is over removed using the stop layer as a mask layer so that spacers of the second sacrificial layer are remained on the substrate to cover portions of sidewalls of the stop layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
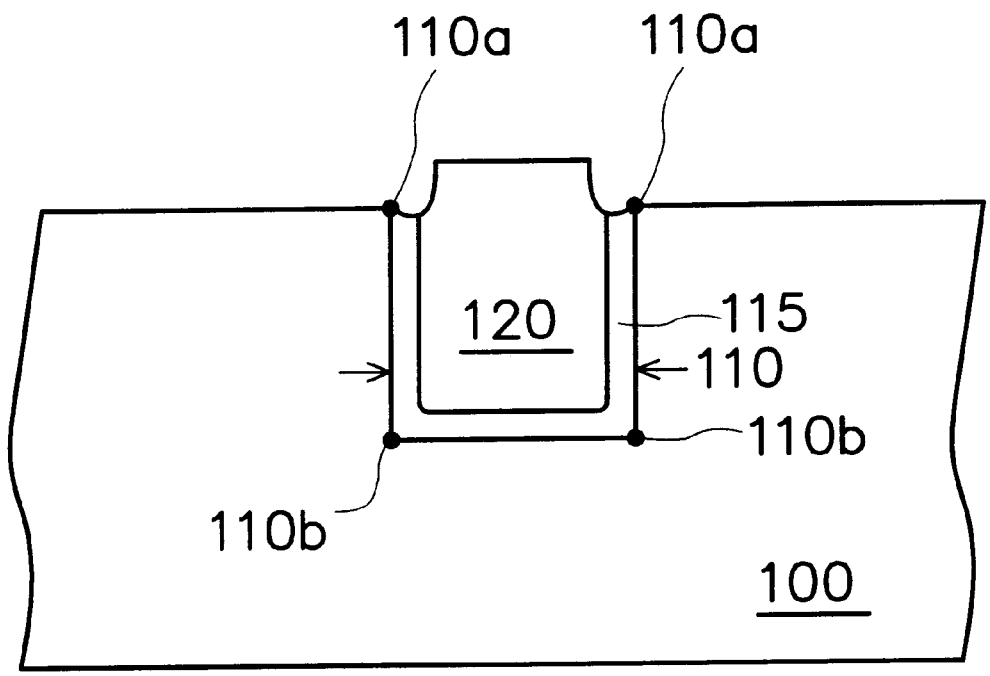
FIG. 1 is a schematic, cross-sectional view of a shallow trench isolation structure.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing a method of forming a shallow trench isolation structure according to one preferred embodiment of this invention.

Figure 2A:
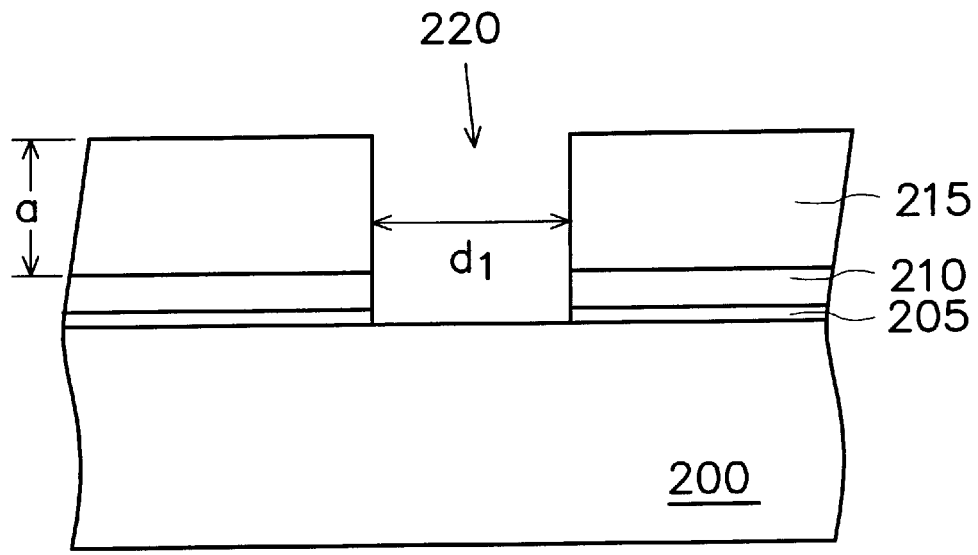
FIGS. 2A through 2D are schematic, cross-sectional views showing a method of forming a shallow trench isolation structure according to one preferred embodiment of this invention.

As shown in FIG. 2A, a semiconductor substrate 200 is provided. A pad oxide layer 205, a stop layer 210 and a first sacrificial layer 215 with a thickness of "a" are subsequently formed over the substrate 200. The pad oxide layer 205 is formed, for example, by thermal oxidation. The stop layer 210 includes, for example, silicon nitride. The stop layer 210 is formed, for example, by chemical vapor deposition (CVD).

The first sacrificial layer 215 includes, for example, polysilicon or silicon oxide, and is preferably made of the same material as the substrate 200 to benefit a later process of forming a trench. For example, if the substrate 200 comprises silicon, then the first sacrificial layer 215 preferably includes polysilicon. The first sacrificial layer 215 is formed, for example, by CVD. The first sacrificial layer 215 is from about 3000 Å to about 4000 Å thick, for example.

A photolithography process is performed on the substrate 200. The first sacrificial layer 215, the stop layer 210, and the pad oxide layer 205 are anisotropically etched to form an opening 220 with a width of "$d_1$" on the substrate 200. For example, if the first sacrificial layer 215 comprises polysilicon, then the first sacrificial layer 215 is removed by reactive ion etching using an etching gas source with chloride (Cl). For example, if the stop layer 210 comprises silicon nitride, then the stop layer 210 is removed by dry etching with a plasma source including $CH_3F$, $CHF_3$, and $NF_3$. The pad oxide layer 205 is removed, for example, by dry etching with $CH_4$ plasma.

Figure 2B:
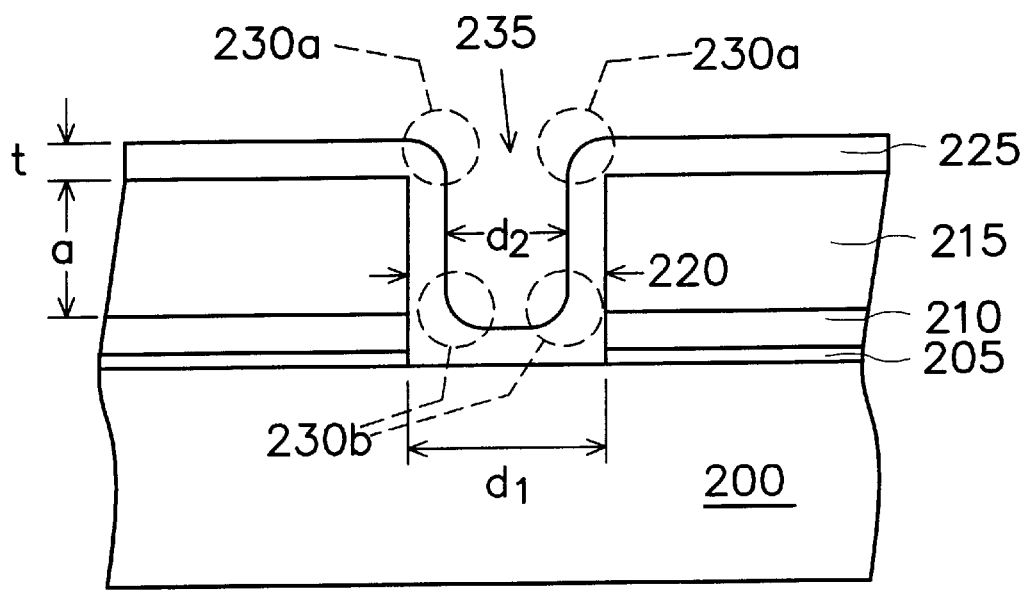

As shown in FIG. 2B, a conformal second sacrificial layer 225 with rounded top corners 230a and bottom corners 230b is formed on the substrate 200. The second sacrificial layer 225 has a thickness "t" less than half of the width "$d_1$" of the opening 220 so that the opening 220 (FIG. 2A) is not filled with the second sacrificial layer 225 and an opening 235 with width "$d_2$" is formed on the substrate 200. The thickness "t" of the second sacrificial layer 225 is preferably about 1000 Å.

The second sacrificial layer 225 includes, for example, polysilicon or silicon oxide, and is preferably made of the same material as the substrate 200 to benefit a later process of forming a trench. For example, if the substrate 200 comprises silicon, then the second sacrificial layer 225 preferably comprises polysilicon. The second sacrificial layer 225 is formed, for example, by CVD. The second sacrificial layer 225 has the rounded top corners 230a and the rounded bottom corners 230b, in other words, the second sacrificial layer 225 has a smooth profile.

Figure 2C:
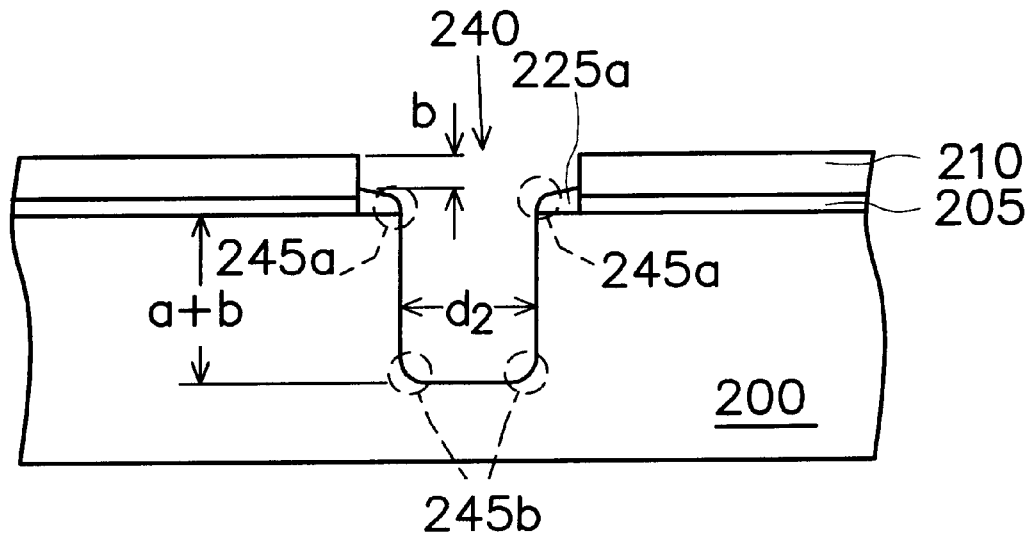

As shown in FIG. 2C, using the stop layer 210 as a removal stop layer, the second sacrificial layer 225 (FIG. 2B), the first sacrificial layer 215 (FIG. 2B), and a part of the substrate 200 are anisotropically removed to form a trench 240 is formed in the substrate 200. The smooth second sacrificial layer's 225 (FIG. 2B) profile is copied to the trench 240. Therefore, the trench 240 has rounded top corners 245a and rounded bottom corners 245b (FIG. 2B). Using the stop layer 210 as a mask layer, the substrate 200 is over etched. A part of the substrate 200 with a depth "b" is removed, and then spacers 225a of the second sacrificial layer 225 (FIG. 2B) are remained on the substrate 200 to cover a portion of sidewalls of the stop layer 210.

Since the surface shape of the trench 240 is copied from the second sacrificial layer's 225 (FIG. 2B), the trench 240 has rounded corners 245a, 245b (a smooth profile) and has a "$d_2$" width. Therefore, the trench 240 with about depth "a+b" is formed.

According to aforementioned, the first sacrificial layer 215 (FIG. 2A, 2B) and the second sacrificial layer 225 (FIG. 2B) preferably includes the same material as the substrate's 200. This is because the first sacrificial layer 215 (FIG. 2A, 2B), the second sacrificial layer 225 (FIG. 2B), and the substrate 200 are simultaneously removed at this step. If the three layers have the same material, the three layers can be easily removed by the same removing method. The material of the stop layer 210 is different from that of the three layers, therefore, while removing the three layers, the stop layer 210 is not removed. If the first sacrificial layer 215 (FIG. 2A, 2B) and the second sacrificial layer 225 (FIG. 2B) do not have the same material as the substrate 200, and a method is found that can remove the three layers while not removing the stop layer 210, then the method can work at this etching step. For example, if the substrate 200 comprises silicon, then the first sacrificial layer 215 (FIG. 2A, 2B) and the second sacrificial layer 225 (FIG. 2B) include silicon oxide.

Figure 2D:
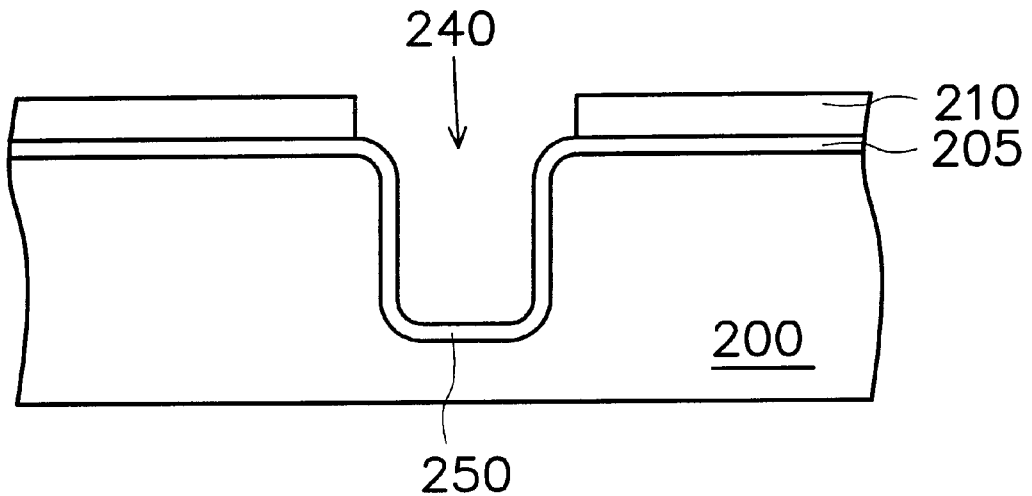

As shown in FIG. 2D, a liner oxide layer 250 is formed on the trench 240, for example, by thermal oxidation. If the spacers 225a (FIG. 2C) comprise polysilicon, the spacers 225a (FIG. 2C) may be oxidized as silicon oxide. Subsequent processes for forming the shallow trench isolation structures (STI) are carried out. Since these operations are not directly related to the invention, detailed description is omitted here.

In summary, features of the invention include:

1. The invention fabricates a shallow trench isolation structure with rounded top corners and bottom corners, which can decrease an electric field and stress that the corners of the trench suffer. Thus, a leakage current generated by the trench structural defect is avoided.

2. The invention fabricates a trench with smaller dimension so that integration of devices is increased to satisfy requirements of semiconductor device fabrications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a shallow trench isolation (STI) structure, comprising:

providing a substrate;

forming a stop layer on the substrate;

forming a first sacrificial layer on the stop layer;

defining the first sacrificial layer and the stop layer to form an opening on the substrate;

forming a conformal second sacrificial layer with rounded corners on the substrate;

anisotropically removing the second sacrificial layer, the first sacrificial layer, and a portion of the substrate to form a trench in the substrate using the stop layer as a removal stop layer; and over removing the substrate using the stop layer as a mask layer so that spacers of the second sacrificial layer are remained on the substrate to cover parts of sidewalls of the stop layer.

2. The method according to claim 1, wherein the substrate, the first sacrificial layer, and the second sacrificial layer have a high selectivity to the stop layer.

3. The method according to claim 1, wherein the stop layer comprises silicon nitride formed by chemical vapor deposition.

4. The method according to claim 1, wherein the first sacrificial layer comprises polysilicon formed by chemical vapor deposition.

5. The method according to claim 1, wherein the first sacrificial layer comprises silicon oxide formed by chemical vapor deposition.

6. The method according to claim 1, wherein the first sacrificial layer has the same material as the substrate.

7. The method according to claim 1, wherein the opening is formed by anisotropic etching.

8. The method according to claim 1, wherein the second sacrificial layer comprises polysilicon formed by chemical vapor deposition.

9. The method according to claim 1, wherein the second sacrificial layer comprises silicon oxide formed by chemical vapor deposition.

10. The method according to claim 1, wherein the second sacrificial layer has the same material as the substrate.

11. The method according to claim 1, wherein the second sacrificial layer has a thickness less than half of width of the opening.

12. The method according to claim 1, wherein the method further comprises a thermal oxidation process to form a silicon oxide layer on the trench.

13. The method according to claim 12, wherein the spacers are oxidized as oxide.

* * * * *